United States Patent
Kimura et al.

(10) Patent No.: US 9,024,710 B2
(45) Date of Patent: May 5, 2015

(54) LOW-VOLTAGE ACTIVE INDUCTOR

(75) Inventors: Hiroshi Kimura, San Jose, CA (US);
Ram Surya Narayan, San Jose, CA (US); Ashutosh K. Sinha, Santa Clara, CA (US)

(73) Assignee: LSI Corporation, Milpitas, CA (US)

( * ) Notice: Subject to any disclaimer, the term of this patent is extended or adjusted under 35 U.S.C. 154(b) by 311 days.

(21) Appl. No.: 13/560,893

(22) Filed: Jul. 27, 2012

(65) Prior Publication Data

US 2014/0028416 A1 Jan. 30, 2014

(51) Int. Cl.
*H03H 11/04* (2006.01)
*H03H 11/48* (2006.01)

(52) U.S. Cl.
CPC .................................... *H03H 11/48* (2013.01)

(58) Field of Classification Search
USPC ............................................................ 333/214
See application file for complete search history.

(56) References Cited

U.S. PATENT DOCUMENTS 4,551,705 A * 11/1985 Anderson ...................... 341/136
5,475,336 A * 12/1995 Singh et al. .................... 327/543
2011/0037526 A1* 2/2011 Sato et al. ................... 331/116 R

OTHER PUBLICATIONS

C. Andriesei et al., "Improved RF CMOS Active Inductor With High Self Resonant Frequency," Author Manuscript, 2010, pp. 1092-1095, IEEE International Conference on Electronics, Circuits, and Systems, Athens, Greece.
Akhil Gupta et al., "Low Voltage High-Q CMOS Active Inductor for RF Applications," paper, 2010, http://www.iiis.org/CDs2010/CD2010IMC/ISAS_2010/PapersPdf/UA836EE.pdf, The George Washington University, Washington, DC.
Yen-Sung Michael Lee et al., "Design of an Active-Inductor-Based Termination Circuit for High-Speed I/O," Circuits and Systems, 2008, ISCAS 2008, IEEE International Symposium on Digital Object Identifier, pp. 3061-3064, British Columbia, Canada.
Curtis Leifso et al., "A Fully Integrated Active Inductor with Independent Voltage Tunable Inductance and Series-Loss Resistance," IEEE Transactions on Microwave Theory and Techniques, Apr. 2001, pp. 671-676., vol. 49, No. 4.

* cited by examiner

*Primary Examiner* — Stephen E Jones
*Assistant Examiner* — Scott S Outten
(74) *Attorney, Agent, or Firm* — Sheridan Ross P.C.

(57) ABSTRACT

An active inductor circuit includes a field-effect transistor having a first source/drain adapted for connection with a first voltage source, a capacitor coupled between the first voltage source and a gate of the field-effect transistor, a resistor coupled between a second source/drain of the field-effect transistor and the gate of the field-effect transistor, and a current source coupled with the gate of the field-effect transistor. A voltage headroom of the active inductor circuit is controlled as a function of at least one of a magnitude of current generated by the current source and a resistance of the resistor.

22 Claims, 4 Drawing Sheets

LOW-VOLTAGE ACTIVE INDUCTOR

BACKGROUND

For high-speed electronic circuits, a passive inductor is typically used in order to achieve higher bandwidth. However, for circuits fabricated on silicon, passive inductors (e.g., spiral inductors) require a significant amount of chip area. Consequently, use of passive inductors in high-speed integrated circuits is impractical and/or undesirable.

SUMMARY

Embodiments of the invention provide novel techniques for fabricating an active inductor on silicon, or on an alternative semiconductor material. An active inductor circuit according to embodiments of the invention is suitable for use with a lower supply voltage compared to conventional active inductor circuit arrangements and does not require any special devices, such as, for example, a native transistor. A transistor forming an active element of the active inductor circuit can be made small so as to achieve enhanced high-frequency performance.

In accordance with an embodiment of the invention, an active inductor circuit includes a field-effect transistor having a first source/drain adapted for connection with a first voltage source, a capacitor coupled between the first voltage source and a gate of the field-effect transistor, a resistor coupled between a second source/drain of the field-effect transistor and the gate of the field-effect transistor, and a current source coupled with the gate of the field-effect transistor. A voltage headroom of the active inductor circuit is controlled as a function of at least one of a magnitude of current generated by the current source and a resistance of the resistor.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
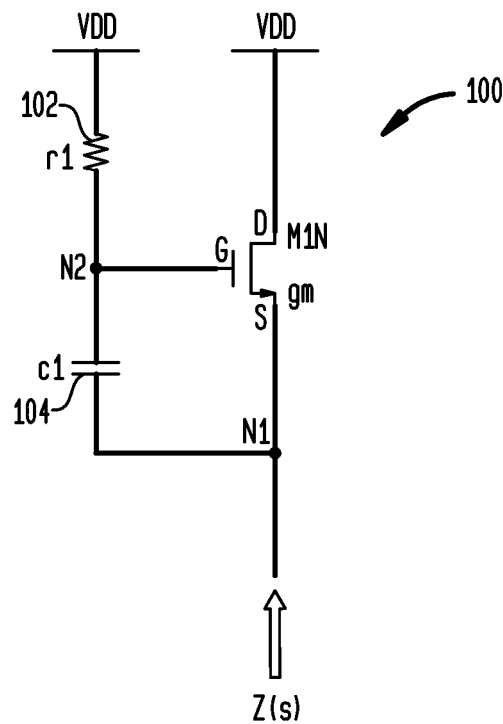
FIG. 1 is a schematic diagram depicting at least a portion of an exemplary active inductor circuit, which can be modified to implement embodiments according to the invention.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Embodiments of the invention will be described herein in the context of illustrative low-voltage, high-bandwidth active inductor circuits. It should be understood, however, that embodiments of the invention are not limited to these or any other particular circuits and/or methods. Rather, embodiments of the invention are more broadly related to techniques for fabricating an active inductor in an integrated circuit in a manner which achieves high-frequency performance and advantageously reduces the required supply voltage and integrated circuit area, among other benefits. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

As a preliminary matter, for the purposes of clarifying and describing embodiments of the invention, the following table provides a summary of certain acronyms and their corresponding definitions, as the terms are used herein:

Table of Acronym Definitions

| Acronym | Definition |
| --- | --- |
| MOSFET | Metal-oxide-semiconductor field-effect transistor |
| MISFET | Metal-insulator-semiconductor field-effect transistor |
| PMOS | P-channel metal-oxide-semiconductor |
| PFET | P-channel field-effect transistor |
| NMOS | N-channel metal-oxide-semiconductor |
| NFET | N-channel field-effect transistor |
| CMOS | Complementary metal-oxide-semiconductor |
| MOS | Metal-oxide-semiconductor |
| IC | Integrated circuit |
| W/L | Channel width-to-length ratio |

For the purpose of describing and claiming the invention, the term MOSFET as used herein is intended to be construed broadly and to encompass any type of metal-insulator-semiconductor field-effect transistor (MISFET). The term MOSFET is, for example, intended to encompass semiconductor field-effect transistors that utilize an oxide material as their gate dielectric, as well as those that do not. In addition, despite a reference to the term "metal" in the acronyms MOSFET and MISFET, the terms MOSFET and MISFET are also intended to encompass semiconductor field-effect transistors wherein the gate is formed from a non-metal such as, for instance, polysilicon.

Although implementations of the present invention described herein may be implemented using p-channel MISFETs (hereinafter called "PMOS" or "PFET" devices) and n-channel MISFETs (hereinafter called "NMOS" or NFET devices), as may be formed using a CMOS fabrication process, it is to be appreciated that the invention is not limited to such transistor devices and/or such a fabrication process, and that other suitable devices, such as, for example, FinFETs, bipolar junction transistors, etc., and/or fabrication processes (e.g., bipolar, BiCMOS, etc.), may be similarly employed, with or without modification to the circuits described herein, as will be understood by those skilled in the art. Moreover, although preferred embodiments of the invention are typically fabricated in a silicon wafer, embodiments of the invention can alternatively be fabricated in wafers comprising other materials, including but not limited to Gallium Arsenide, Indium Phosphide, etc.

FIG. 1 is a schematic diagram depicting an exemplary active inductor circuit 100, which can be modified to implement aspects in accordance with embodiments of the invention. The active inductor circuit 100 includes an NFET M1N, a resistor 102 having a resistance r1 associated therewith, and a capacitor 104 having a capacitance c1 associated therewith. A drain (D) of NFET M1N is adapted for connection with a first voltage source, which in this example is VDD, a source (S) of M1N is connected with a first terminal of capacitor 104 at node N1, a gate (G) of M1N is connected with a second terminal of capacitor 104 and a first terminal of resistor 102 at node N2, and a second terminal of resistor 102 is adapted for connection with VDD. With the inductor circuit 100 configured in this manner, an impedance, Z(s), looking into the source of NFET M1N at node N1 can be calculated using the following expression:

$$Z(s) = \frac{s \cdot r1 \cdot c1 + 1}{g_m}, \quad (1)$$

where $g_m$ represents a small-signal transconductance from gate to channel of M1N, r1 is the resistance value of resistor 102, and c1 is the capacitance value of capacitor 104.

It is to be appreciated that, because a metal-oxide-semiconductor (MOS) device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain.

While the active inductor circuit 100 has a significantly reduced IC area requirement compared to a corresponding passive inductor of the same inductance value, a disadvantage of the inductor circuit 100 is that it needs a relatively large supply voltage to operate, such as, for example, greater than a gate-to-source voltage ($V_{gs}$) of an NFET device, typically about 0.4 to about 0.7 volt, depending on the fabrication process. This larger supply voltage is required in order to provide sufficient headroom for the gate-to-source voltage of the NFET M1N in the active inductor circuit 100. Using a native n-channel device for NFET M1N (assuming a p-type substrate is used) can reduce the required gate-to-source voltage. This is due, at least in part, to the fact that a threshold voltage, $V_t$, of a native MOS device is substantially lower than the threshold voltage of a standard NFET device. As will be known by those skilled in the art, a native n-channel device refers to an NMOS device formed directly in the substrate (i.e., with its source tied to the substrate); in essence, a non-doped transistor. However, while the $V_{gs}$ of the native n-channel device can be lowered compared to a traditional (e.g., non-native) NFET device, a channel length of the native device would need to be relatively large, which accordingly reduces a bandwidth of the active inductor circuit 100 due primarily to increased parasitic capacitance associated with the larger device size.

Figure 2:
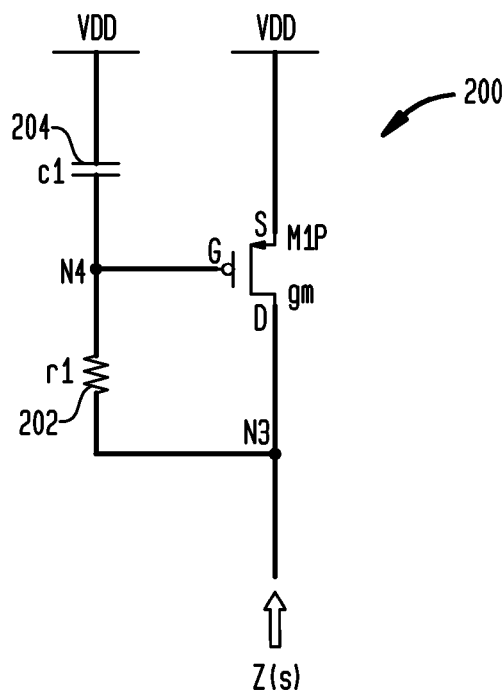
FIG. 2 is a schematic diagram depicting an alternative exemplary active inductor circuit, which can be modified to implement embodiments according to the invention.

FIG. 2 is a schematic diagram depicting an alternative exemplary active inductor circuit 200, which can be modified to implement aspects in accordance with embodiments of the invention. In this illustrative active inductor circuit 200, a PFET device is employed in place of the NFET device M1N used in the inductor circuit 100 shown in FIG. 1. Specifically, the active inductor circuit 200 includes a PFET M1P, a resistor 202 having a resistance r1 associated therewith, and a capacitor 204 having a capacitance c1 associated therewith. A source of PFET M1P is adapted for connection with a first voltage source, which in this example is VDD, a drain of M1P is connected with a first terminal of resistor 202 at node N3, a gate of M1P is connected with a second terminal of resistor 202 and a first terminal of capacitor 204 at node N4, and a second terminal of capacitor 204 is adapted for connection with VDD. With the inductor circuit 200 configured in this manner, an impedance, Z(s), looking into the drain of PFET M1P at node N3 can be calculated using equation (1) above, where in this example, $g_m$ represents a transconductance of the PFET device M1P, r1 is the resistance value of resistor 202, and c1 is the capacitance value of capacitor 204.

Like the exemplary active inductor circuit 100 shown in FIG. 1, the active inductor circuit 200 shown in FIG. 2 requires a relatively large supply voltage in order to provide sufficient headroom for a gate-to-source voltage ($V_{gs}$) of the PFET M1P. Furthermore, assuming a p-type substrate is used (as is typical), a native p-channel device is not available for reducing the required gate-to-source voltage of PFET M1P.

Figure 3:
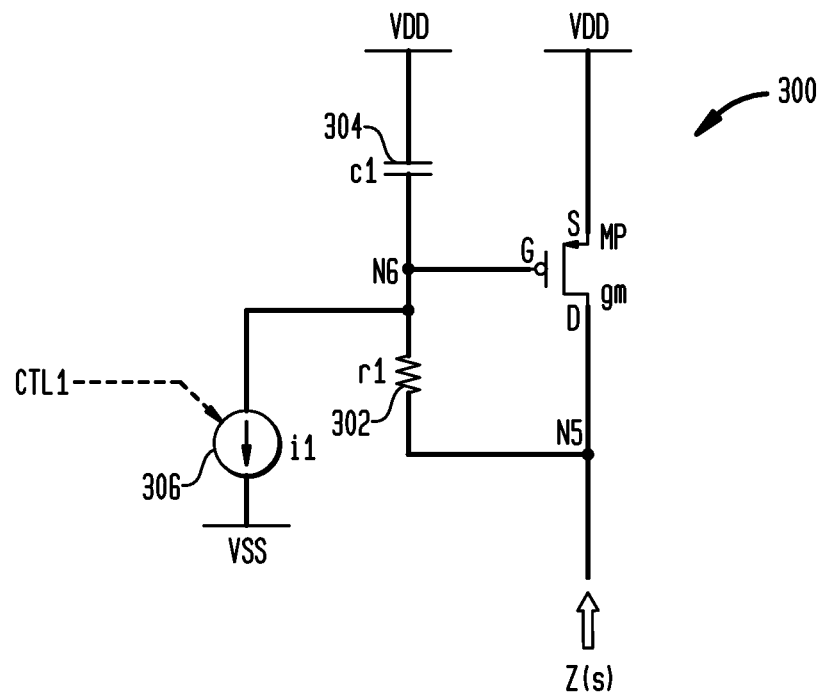
FIG. 3 is a schematic diagram depicting at least a portion of an exemplary active inductor circuit, according to an embodiment of the invention.

FIG. 3 is a schematic diagram depicting at least a portion of an exemplary active inductor circuit 300, according to an embodiment of the invention. The active inductor circuit 300 includes a PFET device MP as the active element, a resistor 302 having a resistance r1 associated therewith, and a capacitor 304 having a capacitance c1 associated therewith. A source of PFET MP is adapted for connection with a first voltage source, which in this embodiment is VDD, a drain of MP is connected with a first terminal (i.e., node) of resistor r1 at node N5, a gate of MP is connected with a second terminal of r1 and a first terminal of capacitor c1 at node N6, and a second terminal of c1 is adapted for connection with VDD. With the active inductor circuit 300 configured in this manner, an impedance, Z(s), looking into the drain of PFET MP at node N5 can be calculated using equation (1) above, where in this example, $g_m$ represents a transconductance of the PFET device MP, r1 is the resistance value of resistor 302, and c1 is the capacitance value of capacitor 304.

Figure 4:
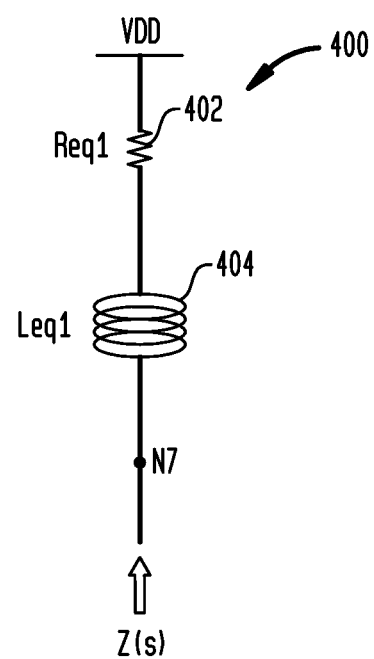
FIG. 4 is a schematic diagram depicting an equivalent model for the active inductor circuit shown in FIG. 3 using a resistor-inductor (RL) network.

An equivalent model for the active inductor circuit 300 using a resistor-inductor (RL) network 400 is shown in FIG. 4. The RL network 400 includes an equivalent resistor 402, having a resistance Req1 associated therewith, and an equivalent inductor 404, having an inductance Leq1 associated therewith, coupled together in series between VDD and node N7. Values for the equivalent resistance Req1 and inductance Leq1 are determined using the following expressions:

$$Req1 = \frac{1}{g_m} \quad (2)$$

$$Leq1 = \frac{c1 \cdot r1}{g_m},$$

where $g_m$ is the transconductance of the PFET device MP, r1 is the resistance value of resistor 302, and c1 is the capacitance value of capacitor 304 in FIG. 3. The above equation (2) for equivalent inductance Leq1 is valid, to at least a first order approximation, when $s \cdot c1 \cdot r1 \gg 1$. The impedance Z(s) looking into node N7 is determined as Z(s)=Req1+Leq1. Substituting the values for Req1 and Leq1 from equations (2) above yields the expression for Z(s) set forth in equation (1).

With continued referenced to FIG. 3, in order to reduce a voltage headroom of the active inductor circuit 300 sufficient for a desired operation of the circuit, the active inductor circuit further includes a current source 306 having a first terminal connected with node N6 and having a second terminal adapted for connection with a second voltage source, which in this embodiment is VSS. It is to be understood that embodiments of the invention are not limited to any specific values for the first and second voltage sources. The current source 306 is operative to generate a positive current, i1, which flows in a direction from the drain of PFET MP, through resistor 302, to VSS. In this circuit configuration, a drain-to-source voltage, $V_{ds}$, of the PFET MP can be expressed as follows:

$$V_{ds}=V_{gs}-(r1 \cdot i1),$$

where $V_{gs}$ represents a difference between a gate voltage, $V_g$, and a source voltage, $V_s$, of the PFET MP (e.g., $V_{gs}$=VDD– $V_g$), r1 is the resistance value of resistor 302, and i1 is the current generated by the current source 306.

In accordance with an illustrative embodiment of the invention, the current source 306 comprises a programmable current source. An output current i1 generated by the programmable current source is controlled as a function of at least a first control signal, CTL1, supplied thereto. Further details regarding an exemplary embodiment of a programmable current source suitable for use in the active inductor circuit 300 will be discussed below in conjunction with FIG. 5.

When the current i1 is set to zero, operation of the active inductor circuit 300 resembles that of the active inductor circuit 200 shown in FIG. 2. However, when the current i1 is set to a non-zero value, the drain-to-source voltage $V_{ds}$ of the PFET MP is reduced by an amount proportional to the current i1, thereby beneficially lowering the voltage headroom of the active inductor circuit 300. More particularly, the reduction in voltage headroom will be equal to the quantity r1·i1, and is hence controllable as a function of the current i1, assuming the resistance value r1 is fixed. In other embodiments, resistor 302 may be implemented as a programmable resistor (i.e., having a variable resistance r1 associated therewith). Using such arrangements, the voltage headroom of the active inductor circuit 300 can be controlled as a function of the current i1 (when a programmable current source 306 is employed) and/or the resistance r1 (when a programmable resistor 302 is employed).

From a frequency performance perspective, based on the expression for impedance in equation (1) above, a zero-frequency point of the active inductor circuit 300 can be controlled (i.e., tuned) by varying the resistance r1, the capacitance c1, or both r1 and c1. Varying the resistance r1 and/or the capacitance c1 can be performed independently of the current i1. As stated above, the voltage headroom is controlled as a function of the current i1, the resistance r1, or both i1 and r1. Therefore, once a desired frequency characteristic of the active inductor circuit 300 is established (e.g., by fixing r1 and c1), the voltage headroom of the active inductor circuit can be programmed by controlling the current i1 independently of the resistance r1.

A size of the PFET device MP, defined, for example, as a ratio of a channel width to a channel length of the device, can be made substantially small (e.g., minimum dimensions allowed by the fabrication process) to reduce parasitic capacitance and thereby improve high-frequency performance (e.g., bandwidth) of the active inductor circuit 300. Moreover, the supply voltage of the circuit can be reduced without requiring the use of a special device (e.g., native transistor) as the active element.

Figure 5:
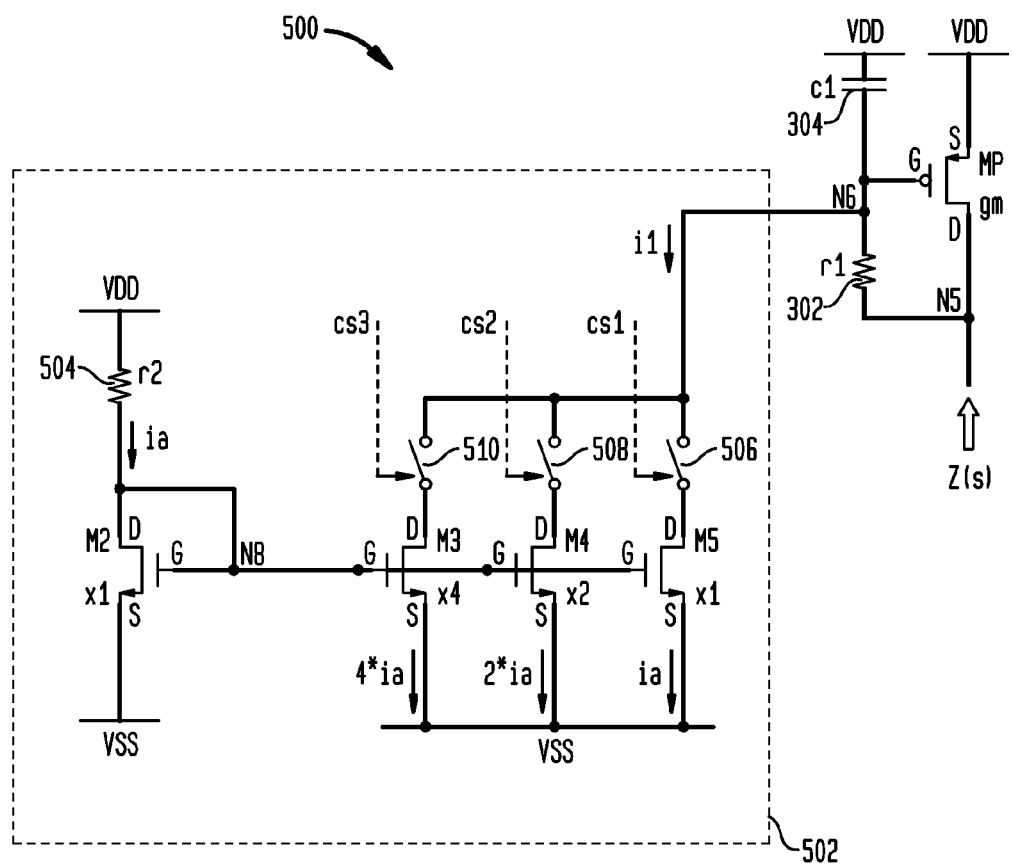
FIG. 5 is a schematic diagram depicting at least a portion of an exemplary active inductor circuit which employs a programmable current source, according to an embodiment of the invention.

FIG. 5 is a schematic diagram depicting at least a portion of an exemplary active inductor circuit 500 which employs a programmable current source, according to an embodiment of the invention. The active inductor circuit 500 is essentially the same as the illustrative active inductor circuit 300 shown in FIG. 3, but showing details of the current source. Specifically, the active inductor circuit 500 includes a programmable current source 502 coupled with node N6 which is suitable for use in implementing the current source 306 shown in FIG. 3.

The programmable current source 502 includes a resistor 504 having a resistance r2 associated therewith coupled with a first NFET M2 connected in a diode arrangement. More particularly, a first terminal of resistor 504 is adapted for connection with a first voltage source, which in this embodiment is VDD, a second terminal of resistor 504 is connected with a drain and gate of NFET M2, and a source of M2 is adapted for connection with a second voltage source, which in this embodiment is VSS. The arrangement of NFET M2 and resistor 504 forms a bias circuit for generating a reference current, ia, with a magnitude of the current ia being a function of resistance r2.

The reference current ia generated by the bias circuit is mirrored to a plurality of selectable current segments (i.e., legs), a sum of the currents in each of one or more active (i.e., selected) current segments being equal to the current i1 used to control the amount of voltage headroom of the active inductor circuit 500. Each current segment is formed as a series combination of an NFET and a switch. Specifically, the programmable current source 502 includes a second NFET M3 connected with node N6 of the active inductor circuit 500 via a first switch 510, a third NFET M4 connected with node N6 via a second switch 508, and a fourth NFET M5 connected with node N6 via a third switch 506. Gates of NFETs M3, M4 and M5 and connected with the gate of NFET M2 at node N8, sources of M3, M4 and M5 are adapted for connection with VSS, a drain of M3 is connected with a first terminal of switch 510, a drain of M4 is connected with a first terminal of switch 508, a drain of M5 is connected with a first terminal of switch 506, and second terminals of the respective switches 506, 508 and 510 are connected to node N6.

Although represented symbolically in FIG. 5 as single-pole single-throw (SPST) switches, it is to be understood that each of the switches 506, 508, 510 may be implemented using essentially any switching element, such as, but not limited to, an MOS device, a microelectromechanical systems (MEMS) device, etc., as will become apparent to those skilled in the art. Each of at least a subset of the switches 506, 508 and 510 is independently controlled by a corresponding control signal cs1, cs2 and cs3, respectively; activation of a given switch enables a prescribed current to flow through the corresponding NFET of that current leg. In this embodiment, the respective currents generated in the current segments are binary weighted relative to one another, such that the current generated in M5 is configured to be equal to the reference current (i.e., ia), the current generated in M4 is configured to be twice the reference current (i.e., 2*ia), and the current generated in M3 is configured to be four times the reference current (i.e., 4*ia). To accomplish this, given that NFETs M3, M4 and M5 are connected in a mirror configuration with NFET M2 (i.e., the gates of M2, M3, M4 and M5 are connected together and the sources of M2, M3, M4 and M5 are connected together), a size (e.g., channel width-to-length ratio (W/L)) of M5 relative to M2 is scaled to be equal (×1), a size of M4 relative to M2 is scaled by two (×2), and a size of M3 relative to M2 is scaled by four (×4). Hence, a current generated in each current segment will be a function of a scaling factor (i.e., ratio of sizes) between the NFET device in that current segment and the reference NFET (M2).

Using the binary weighting scheme in the programmable current source 502, the current i1, in this embodiment, can be expressed as $$i1=(cs1+2 \cdot cs2+4 \cdot cs3) \cdot ia, \qquad (3)$$

where cs1, cs2 and cs3 are indicative of respective logic states of the corresponding control signals cs1, cs2 and cs3, respectively, which can take on a value of either zero (0), representing an inactive control signal, or one (1), representing an active control signal. For example, if switches 506 and 510 are enabled and switch 508 is disabled, cs1 and cs3 would be equal to 1 and cs2 would be equal to 0, and current i1 would be determined to be 5*ia using equation (3) above. It is to be appreciated that the invention is not limited to a programmable current source having a binary weighting arrangement; rather, other current scaling and weighting arrangements are similarly contemplated, according to embodiments of the invention.

Figure 6:
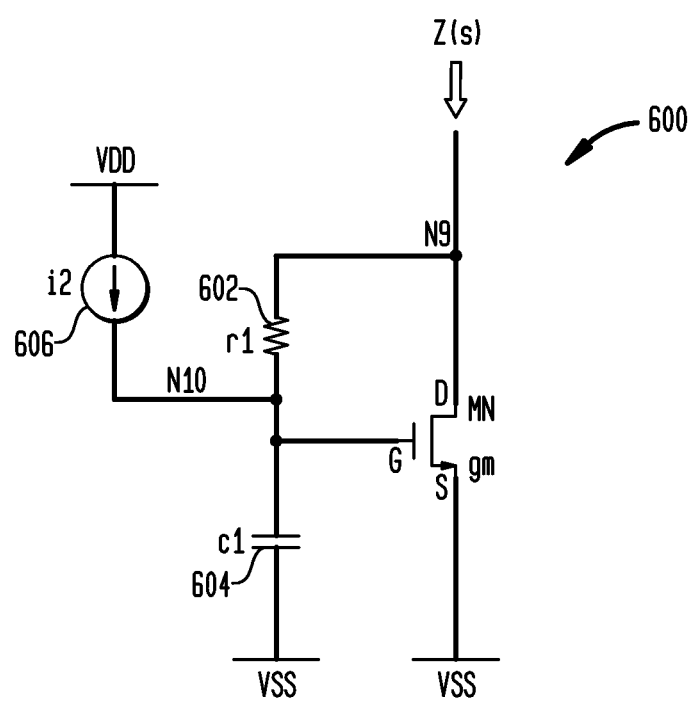
FIG. 6 is a schematic diagram depicting at least a portion of an exemplary active inductor circuit, according to another embodiment of the invention.

Although each of the exemplary active inductor circuits 300 and 500 depicted in FIGS. 3 and 5, respectively, include a PFET device as the active element, an active inductor circuit employing a different active element is similarly contemplated other embodiments of the invention. For example, FIG. 6 is a schematic diagram depicting at least a portion of an exemplary active inductor circuit 600 employing an NFET device as the active element, according to an embodiment of the invention. More particularly, the active inductor circuit 600 includes an NFET device MN as the active element, a resistor 602 having a resistance r1 associated therewith, and a capacitor 604 having a capacitance c1 associated therewith. A source of NFET MN is adapted for connection with a first voltage source, which in this embodiment is VSS, a drain of MN is connected with a first terminal of resistor r1 at node N9, a gate of MN is connected with a second terminal of r1 and a first terminal of capacitor c1 at node N10, and a second terminal of c1 is adapted for connection with VSS. The active inductor circuit 600 further includes a current source 606 having a first terminal connected with node N10 and having a second terminal adapted for connection with a second voltage source, which in this embodiment is VDD. The current source 606 is operative to generate a positive current, i2, which flows in a direction from VDD, through resistor 602, to the drain of NFET MN. With the active inductor circuit 600 configured in this manner, an impedance, Z(s), looking into the drain of NFET MN at node N9 can be calculated using equation (1) above, where in this example, $g_m$ represents a transconductance of the NFET device MN, r1 is the resistance value of resistor 602, and c1 is the capacitance value of capacitor 604.

At least a portion of the embodiments of the invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which inductors may be employed. Suitable applications and systems for implementing techniques according to embodiments of the invention may include, but are not limited to, communications systems, serializers/deserializers, phase-locked loops, amplifiers, input/output interface circuitry, timing circuitry, clock and data recovery, electrostatic discharge protection, etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the inventive subject matter are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An active inductor circuit, comprising:
a field-effect transistor having a first source/drain adapted for connection with a first voltage source;
a capacitor coupled between the first voltage source and a gate of the field-effect transistor;

a resistor coupled between a second source/drain of the field-effect transistor and the gate of the field-effect transistor; and a current source coupled between the gate of the field-effect transistor and a second voltage source, a voltage headroom of the active inductor circuit being controlled as a function of at least one of a magnitude of current generated by the current source and a resistance of the resistor.

2. The active inductor circuit of claim 1, wherein the current source comprises a programmable current source, an output current generated by the programmable current source being controlled as a function of at least a first control signal.

3. The active inductor circuit of claim 2, wherein the programmable current source is adapted to receive a plurality of control signals and comprises a plurality of current segments, each of the respective current segments being selectable as a function of a corresponding one of the control signals.

4. The active inductor circuit of claim 3, wherein each of at least a subset of the plurality of current segments comprises a transistor and a switching element connected with the transistor and adapted to receive the corresponding one of the control signals.

5. The active inductor circuit of claim 3, wherein respective currents generated in at least a subset of the current segments are binary weighted relative to one another.

6. The active inductor circuit of claim 2, wherein the programmable current source comprises a bias circuit, operative to generate a reference current, and a plurality of current segments connected with the bias circuit in a current mirror configuration.

7. The active inductor circuit of claim 6, wherein a current generated in a given one of the current segments is a function of a ratio of a size of a transistor in the bias circuit to a size of a transistor in the given current segment.

8. The active inductor circuit of claim 1, wherein the active inductor circuit forms an equivalent passive inductor having a first terminal coupled with the first voltage source and a second terminal formed at the second source/drain of the field-effect transistor.

9. The active inductor circuit of claim 8, wherein an inductance, L, of the equivalent passive inductor is expressed as $$L = \frac{c \cdot r}{g_m},$$

where $g_m$ is a transconductance of the field-effect transistor, r is a resistance of the resistor, and c is a capacitance of the capacitor.

10. The active inductor circuit of claim 1, wherein the field-effect transistor comprises a PFET device having a source adapted for connection with the first voltage source, a drain connected with a first terminal of the resistor, and a gate connected with a second terminal of the resistor and a first terminal of the capacitor.

11. The active inductor circuit of claim 10, wherein the first voltage source is a voltage supply of the active inductor circuit and the second voltage source is a voltage return of the active inductor circuit.

12. The active inductor circuit of claim 1, wherein the field-effect transistor comprises an NFET device having a source adapted for connection with the first voltage source, a drain connected with a first terminal of the resistor, and a gate connected with a second terminal of the resistor and a first terminal of the capacitor.

13. The active inductor circuit of claim 12, wherein the first voltage source is a voltage return of the active inductor circuit and the second voltage source is a voltage supply of the active inductor circuit.

14. The active inductor circuit of claim 1, wherein a first terminal of the current source is connected with the gate of the field-effect transistor and a second terminal of the current source is adapted for connection with the second voltage source.

15. The active inductor circuit of claim 1, wherein a resistance of the resistor is set to a prescribed value and the voltage headroom of the active inductor circuit is controlled as a function of the magnitude of current generated by the current source.

16. The active inductor circuit of claim 1, wherein the resistor comprises a programmable resistor adapted to receive at least one control signal, a resistance of the programmable resistor being controlled as a function of the at least one control signal.

17. The active inductor circuit of claim 1, wherein the active inductor circuit is fabricated in at least one integrated circuit.

18. An electronic system, comprising:
at least one integrated circuit, the integrated circuit comprising at least one active inductor circuit, the at least one active inductor comprising:
a field-effect transistor having a first source/drain adapted for connection with a first voltage source;
a capacitor coupled between the first voltage source and a gate of the field-effect transistor;
a resistor coupled between a second source/drain of the field-effect transistor and the gate of the field-effect transistor; and
a current source coupled between the gate of the field-effect transistor and a second voltage source, a voltage headroom of the active inductor circuit being controlled as a function of at least one of a magnitude of current generated by the current source and a resistance of the resistor.

19. The system of claim 18, wherein the at least one active inductor circuit forms an equivalent passive inductor having a first terminal coupled with the first voltage source and a second terminal formed at the second source/drain of the field-effect transistor.

20. The system of claim 18, wherein the field-effect transistor comprises a PFET device having a source adapted for connection with the first voltage source, a drain connected with a first terminal of the resistor, and a gate connected with a second terminal of the resistor and a first terminal of the capacitor.

21. The system of claim 18, wherein the field-effect transistor comprises an NFET device having a source adapted for connection with the first voltage source, a drain connected with a first terminal of the resistor, and a gate connected with a second terminal of the resistor and a first terminal of the capacitor.

22. The system of claim 18, wherein at least a portion of the system is fabricated in at least one integrated circuit.

* * * * *